(12) United States Patent
Shibata

(10) Patent No.: US 6,726,800 B2
(45) Date of Patent: Apr. 27, 2004

(54) ASHING APPARATUS, ASHING METHODS, AND METHODS FOR MANUFACTURING SEMICONDUCTOR DEVICES

(75) Inventor: Takumi Shibata, Ichinomiya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/183,887

(22) Filed: Jun. 27, 2002

(65) Prior Publication Data

US 2003/0073322 A1 Apr. 17, 2003

(30) Foreign Application Priority Data

Jun. 27, 2001 (JP) ......................................... 2001-194936

(51) Int. Cl.[7] ........................... H05H 1/00; C23C 16/00
(52) U.S. Cl. ............................ 156/345.29; 156/345.33; 156/345.41; 118/715; 118/723 MW
(58) Field of Search ..................... 156/345.41, 345.29, 156/345.33, 345.35, 345.36; 118/715, 723 MW, 723 ME; 438/710, 726, 727, 706

(56) References Cited

U.S. PATENT DOCUMENTS 5,221,424 A 6/1993 Rhoades
5,397,432 A * 3/1995 Konno et al. ............... 438/714
5,961,775 A * 10/1999 Fujimura et al. ...... 156/345.29

FOREIGN PATENT DOCUMENTS

| JP | 02-183524 | 7/1990 |
|---|---|---|
| WO | 00/14793 | 3/2000 |

* cited by examiner

*Primary Examiner*—Parviz Hassanzadeh
(74) *Attorney, Agent, or Firm*—Konrad Raynes & Victor, LLP; Alan S. Raynes

(57) ABSTRACT

A method for manufacturing a semiconductor device in accordance with an embodiment of the present invention includes a step of forming a TiN film 2 on an underlying film 1; a step of coating a photoresist film on the TiN film 2, and exposing and developing the photoresist film; a step of etching the TiN film 2 using the photoresist film 4a as a mask, by using an etching apparatus that etches an Al alloy film; a step of introducing a mixed gas containing $O_2$ gas and $N_2$ gas adjacent to the photoresist film, and plasmatizing the gas to thereby ash the photoresist film, and a step of introducing $H_2O$ gas adjacent to the TiN film, and plasmatizing the gas to thereby ash foreign matters on the TiN film.

9 Claims, 5 Drawing Sheets

Fig. 8 (a) *(Prior Art)*
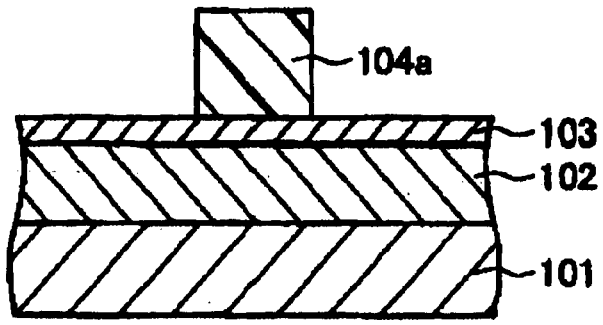
Fig. 8 (b) *(Prior Art)*
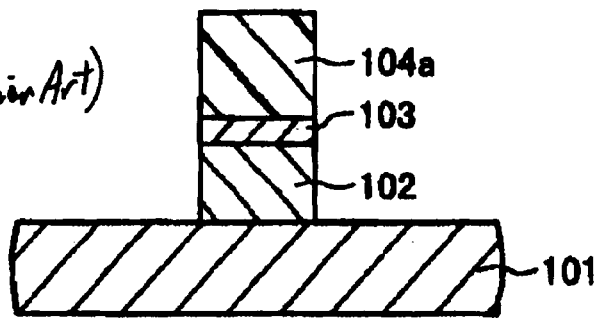
Fig. 8 (c) *(Prior Art)*
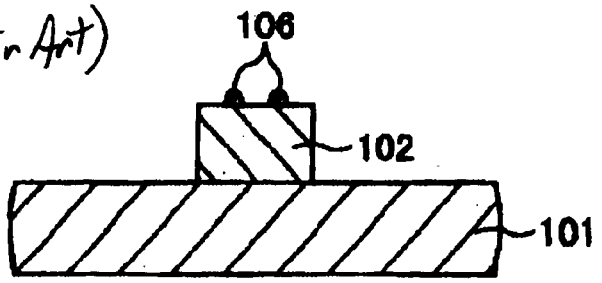

ASHING APPARATUS, ASHING METHODS, AND METHODS FOR MANUFACTURING SEMICONDUCTOR DEVICES

Applicant hereby claims priority in and incorporates by reference in its entirety Japanese Application No. 2001-194936 (P), filed Jun. 27, 2001.

TECHNICAL FIELD

The present invention relates to an ashing apparatus, an ashing method and a method for manufacturing semiconductor devices, which can reduce foreign matters that may remain on a body to be processed.

RELATED ART

FIG. 7 shows a cross-sectional view to describe a conventional method for manufacturing a semiconductor device.

First, a TiN film 102 is formed by sputtering on an underlying film 101. A variety of films can be used for the underlying film 101; for example, a film having a stacked layered structure composed of a TiN film as an underlying layer and an Al alloy film as an upper layer may be used. Next, a BARC 103 that functions as an anti-reflection coating is formed on the TiN film 102. Then, a photoresist film is coated on the BARC 103, and the photoresist film is exposed and developed to thereby form a resist pattern 104a on the BARC 103.

Then, the BARC 103 is dry-etched using the resist pattern 104a as a mask. Next, the TiN film 102 is dry-etched using the resist pattern 104a as a mask.

Next, the underlying film 101 composed of the Al alloy film and TiN film is successively etched. Then, the wafer is removed from the etching apparatus into the atmosphere, and the wafer is introduced in the chamber of the ashing apparatus to thereby remove the resist pattern 104a and the BARC 103 by ashing.

In the conventional method for manufacturing semiconductor devices described above, an etching of the Al alloy film and an etching of the TiN film are conducted in the same etching apparatus. For this reason, products (Al—Cl) generated upon etching the Al alloy film by a Cl containing gas remain in the etching chamber, and there are occasions that the products 105 may remain on the wafer (on underlying film 101) when the TiN film 102 is etched, as shown in FIG. 7. The residual products 105 may react with water in the atmosphere and may grow as foreign matters. These foreign matters become the source of undesirable particles.

FIGS. 8(a)–(c) show cross-sectional views illustrating another conventional method for manufacturing semiconductor devices.

First, as shown in FIG. 8(a), a TiN film 102 is formed by sputtering on an underlying film 101. Next, a BARC 103 that functions as an anti-reflection coating is formed on the TiN film 102. Then, a photoresist film is coated on the BARC 103, and the photoresist film is exposed and developed to thereby form a resist pattern 104a on the BARC 103.

Then, as shown in FIG. 8(b), the BARC 103 is dry-etched using the resist pattern 104a as a mask. Next, the TiN film 102 is dry-etched using the resist pattern 104s as a mask.

Next, the wafer is transferred from the etching apparatus into the ashing chamber, to thereby remove the resist pattern 104a and the BARC 103 by ashing. In this instance, the temperature of the stage in the ashing chamber on which the wafer is mounted is at a high temperature of about 250° C.

In this ashing process, after the wafer is placed on the stage at a high temperature, the wafer is maintained on the stage for about 15 seconds–30 seconds to adjust and stabilize the pressure inside the chamber.

In the other conventional method for manufacturing semiconductor devices described above, the time for adjusting and stabilizing the pressure is relatively long, such that there are occasions that the BARC 103 hardens. For this reason, even if the resist pattern 104a and the BARC 103 are removed by ashing, BARC residues 106 may remain as ashing residues on the TiN film 102. As a result, the reliability of the semiconductor device is lowered.

SUMMARY

Embodiments relate to an ashing apparatus that ashes a photoresist film on a body in which a conducting film has been etched using the photoresist film as a mask, the apparatus including an ashing chamber and a stage for mounting a body to be processed disposed in the ashing chamber. The apparatus also includes a gas introduction system that introduces an ashing gas adjacent to a body to be processed mounted on the stage, and a plasma system that forms a plasma in at least one ashing gas introduced by the gas introduction system, wherein an ashing gas includes $H_2O$ gas.

Embodiments also relate to an ashing method that ashes a photoresist film on a body to be processed in which a TiN film is etched using the photoresist film as a mask, the method including disposing a body to be processed in an ashing chamber. The method also includes a first step of introducing a first ashing adjacent to the body to be processed, and forming a plasma in the first ashing gas and ashing the photoresist film. The method also includes a second step of introducing $H_2O$ gas adjacent to the body to be processed, and forming a plasma in the gas and ashing foreign matter, if present, on the body to be processed.

Embodiments also relate to a method for manufacturing a semiconductor device, the method including a first step of forming a TiN film on an underlying film. The method also includes a second step of coating a photoresist film on the TiN film, and exposing and developing the photoresist film. The method also includes a third step of etching the TiN film using the photoresist film as a mask, by using an etching apparatus that etches an Al alloy film. The method also includes a fourth step of introducing a mixed gas containing $O_2$ gas and $N_2$ gas adjacent to the photoresist film, and forming a plasma in the gas and ashing the photoresist film. The method also includes a fifth step of introducing $H_2O$ gas adjacent to the TiN film, and forming a plasma in the gas and ashing foreign matter, if present, on the TiN film.

Embodiments also relate to a method for manufacturing a semiconductor device, the method including a first step of forming a TiN film on an underlying film, and a second step of forming a BARC on the TiN film. The method also includes a third step of coating a photoresist film on the BARC, and exposing and developing the photoresist film. The method also includes a fourth step of etching the BARC and the TiN film using the photoresist film as a mask, by using an etching apparatus that etches an Al alloy film. The method also includes a fifth step of introducing a mixed gas containing $O_2$ gas and $N_2$ gas adjacent to the photoresist film, and forming a plasma in the gas and ashing the photoresist film and the BARC. The method also includes a sixth step of introducing $H_2O$ gas adjacent to the TiN film, and forming a plasma in the gas and ashing foreign matter, if present, on the TiN film.

Embodiments also relate to an ashing method that ashes a photoresist film on a body to be processed in which a conducting layer has been etched using the photoresist film as a mask, the method including disposing a body to be processed in an ashing chamber. The method also includes introducing a first gas into the chamber, forming a plasma in the first gas and ashing the photoresist film. The method also includes introducing a second gas comprising $H_2O$ gas into the chamber, forming a plasma in the second gas and ashing foreign matter, if present, on the body to be processed. The first gas and the second gas have different compositions.

BRIEF DESCRIPTION OF THE DRAWINGS

Embodiments of the invention are described with reference to the accompanying drawings which, for illustrative purposes, are schematic and not necessarily drawn to scale.

FIGS. 8(a)–(c) show cross-sectional views to describe another conventional method for manufacturing semiconductor devices.

DETAILED DESCRIPTION

Figure 7:
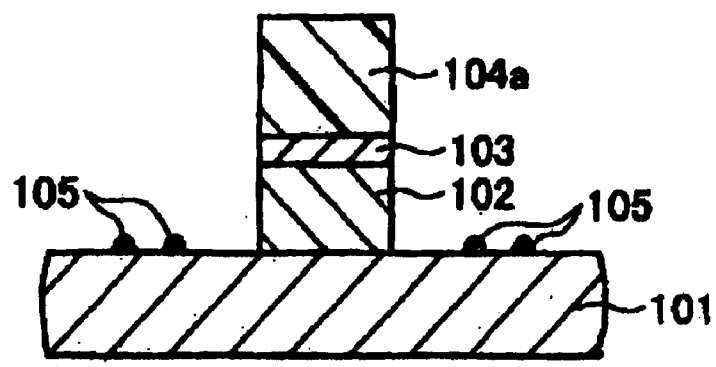
FIG. 7 shows a cross-sectional view to describe a conventional method for manufacturing semiconductor devices.

As described above, by the method for manufacturing a semiconductor device indicated in FIG. 7, products (Al—Cl) remaining in the etching chamber may remain on the wafer when the TiN film 102 is etched, and the residual products 105 may react with water in the atmosphere and grow as foreign matters, which causes the problem of particles. Also, by the method for manufacturing a semiconductor device indicated in FIG. 8, BARC residues 106 may remain as ashing residues on the TiN film 102. As a result, the reliability of the semiconductor device is lowered.

Certain embodiments of the present invention have been made in view of the circumstances described above, and include an ashing apparatus, ashing methods, and methods for manufacturing semiconductor devices that can reduce foreign matters that may remain on bodies to be processed. Also, another object of certain embodiments is to provide an ashing apparatus, ashing methods, and methods for manufacturing semiconductor devices that can suppress ashing residues from remaining on a TiN film.

To solve the problems described earlier, an ashing apparatus in accordance with an embodiment of the present invention pertains to an ashing apparatus that, by using an etching apparatus that etches an Al alloy film, ashes a photoresist film on a body to be processed in which a TiN film is etched using the photoresist film as a mask, the apparatus comprising: an ashing chamber; a stage for mounting a body to be processed disposed in the ashing chamber; a gas introduction system that introduces an ashing gas adjacent to a body to be processed mounted on the stage; and a plasma system that plasmatizes the ashing gas introduced by the gas introduction system, wherein the ashing gas is a mixed gas containing $O_2$ gas and $N_2$ gas or $H_2O$ gas.

By the ashing apparatus described above, even when products remaining in the etching chamber of the etching apparatus remain on a body to be processed, the remaining products can be removed by plasmatizing $H_2O$ gas and ashing them.

Also, in the ashing apparatus in accordance with the present embodiment, when the photoresist film is ashed, the mixed gas containing $O_2$ gas and $N_2$ gas may preferably be introduced adjacent to the body to be processed to perform a first ashing step, and $H_2O$ gas may preferably be introduced adjacent to the body to be processed to perform a second ashing step.

Also, in the ashing apparatus in accordance with the present embodiment, the body to be processed may optionally have a TiN film formed over an underlying film, a BARC formed on the TiN film, and a photoresist film formed on the BARC film.

Also, the ashing apparatus in accordance with the present embodiment may further comprise a temperature controlling system that controls the stage to be at an elevated temperature, wherein, when the photoresist film and the BARC are ashed, before the first ashing step is conducted, the body to be processed may preferably be maintained for about 5 seconds to about 7 seconds on the stage that is controlled to be a high temperature in order to adjust and stabilize a pressure inside the ashing chamber. Because the time for retaining the body to be processed on the stage is short (preferably 5 to 7 seconds), hardening of the BARC may be prevented. Accordingly, even if the photoresist and the BARC are removed by ashing, BARC residues can be inhibited or prevented from remaining as ashing residues on the TiN film. As a result, the reliability of the semiconductor device can be improved.

An ashing method in accordance with an embodiment of the present invention pertains to a method that, by using an etching apparatus that etches an Al alloy film, ashes a photoresist film on a body to be processed in which a TiN film is etched using the photoresist film as a mask, the method comprising: disposing a body to be processed in an ashing chamber; a first step of introducing a mixed gas containing $O_2$ gas and $N_2$ gas adjacent to the body to be processed, and plasmatizing the gas to thereby ash the photoresist film; and a second step of introducing $H_2O$ gas adjacent to the body to be processed, and plasmatizing the gas to thereby ash foreign matters on the body to be processed.

By the ashing method described above, even when products remaining in the etching chamber of the etching apparatus remain on a body to be processed, the remaining products can be removed by plasmatizing $H_2O$ gas and ashing them.

Also, in the ashing method in accordance with the present embodiment, the body to be processed may optionally have a TiN film formed over an underlying film, a BARC formed on the TiN film, and a photoresist film formed on the BARC film.

Also, in the ashing method in accordance with the present embodiment, when the photoresist film and the BARC are ashed, before ashing in the first step, the body to be processed may preferably be maintained for about 5 seconds to about 7 seconds on the stage that is controlled to be at an elevated temperature in order to adjust and stabilize a pressure inside the ashing chamber. Because the time for retaining the body to be processed on the stage is preferably short (5 seconds to 7 seconds), hardening of the BARC can be inhibited or prevented. Accordingly, BARC residues can be inhibited or prevented from remaining as ashing residues on the TiN film.

A method for manufacturing a semiconductor device in accordance with an embodiment of the present invention is characterized in comprising: a step of forming a TiN film on an underlying film; a step of coating a photoresist film on the TiN film, and exposing and developing the photoresist film; a step of etching the TiN film using the photoresist film as a mask, by using an etching apparatus that etches an Al alloy film; a step of introducing a mixed gas containing $O_2$ gas and $N_2$ gas adjacent to the photoresist film, and plasmatizing the gas to thereby ash the photoresist film; and a step of introducing $H_2O$ gas adjacent to the TiN film, and plasmatizing the gas to thereby ash foreign matters on the TiN film.

By the method embodiment for manufacturing a semiconductor device described above, even when products remaining in the etching chamber of the etching apparatus remain on a body to be processed, $H_2O$ gas is plasmatized to ash the remaining products such that these foreign matters can be removed.

Also, in the method for manufacturing a semiconductor device in accordance with the present embodiment, the fourth step may preferably be performed by transferring in vacuum the body to be processed from the etching apparatus after the third step and introducing the same in the ashing apparatus. Because the body to be processed is transferred in vacuum into the ashing apparatus without exposing the body to be processed to the atmosphere, even when products remaining in the etching chamber may remain on the body to be processed, the remaining products are prevented from reacting with water in the atmosphere.

A method for manufacturing a semiconductor device in accordance with the present embodiment is characterized in comprising: a first step of forming a TiN film on an underlying film; a second step of forming a BARC on the TiN film; a third step of coating a photoresist film on the BARC, and exposing and developing the photoresist film; a fourth step of etching the BARC and the TiN film using the photoresist film as a mask, by using an etching apparatus that etches an Al alloy film; a fifth step of introducing a mixed gas containing $O_2$ gas and $N_2$ gas adjacent to the photoresist film, and plasmatizing the gas to thereby ash the photoresist film and the BARC; and a sixth step of introducing $H_2O$ gas adjacent to the TiN film, and plasmatizing the gas to thereby ash foreign matters on the TiN film.

In the method for manufacturing a semiconductor device in accordance with the present embodiment may further comprises the step, between the fourth step and the fifth step, of maintaining a body to be processed for about 5 seconds to about 7 seconds on a stage that is controlled to be at an elevated temperature in order to adjust and stabilize a pressure inside the ashing chamber. Because the time for retaining the body to be processed on the stage is short for 5 seconds to 7 seconds, hardening of the BARC can be prevented. Accordingly, BARC residues can be prevented from remaining as ashing residues on the TiN film.

Certain preferred embodiments of the present invention will be described below with reference to the accompanying drawings.

FIGS. 1–5 shows cross-sectional views illustrating a method for manufacturing a semiconductor device in accordance with an embodiment of the present invention. FIG. 6 shows a structure of an ashing apparatus that us used to remove the resist pattern and BARC (anti-reflection coating) shown in FIG. 4.

Figure 1:
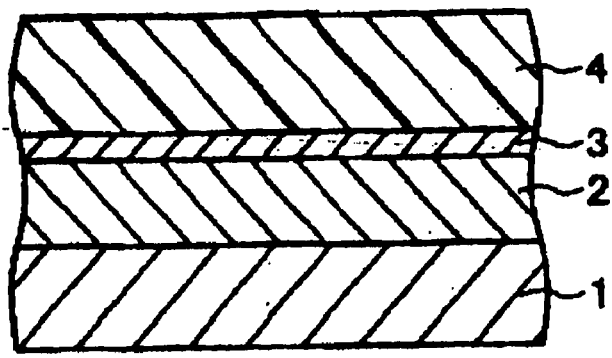
FIG. 1 shows a cross-sectional view illustrating a method for manufacturing a semiconductor device in accordance with an embodiment of the present invention.

As shown in FIG. 1, first, an underlying film 1 is formed above a silicon substrate. A variety of films can be used for the underlying film 1; for example, a film having a stacked layered structure composed of a TiN film as a lower layer and an Al alloy film as an upper layer may be used. Next, a TiN film 2 is formed by sputtering on the underlying film 1. Then, a BARC 3 that functions as an anti-reflection coating is formed on the TiN film 2. Then, a photoresist film 4 is coated on the BARC 3.

Figure 2:
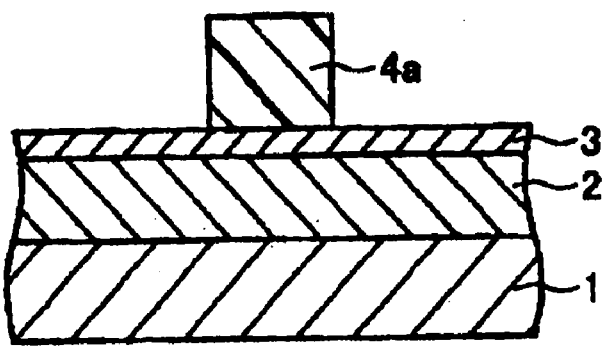
FIG. 2 shows a method for manufacturing a semiconductor device in accordance with an embodiment of the present invention, and shows a cross-sectional view of the next step after FIG. 1.

Next, as shown in FIG. 2, the photoresist film 4 is exposed and developed to thereby form a resist pattern 4a on the BARC 3.

Figure 3:
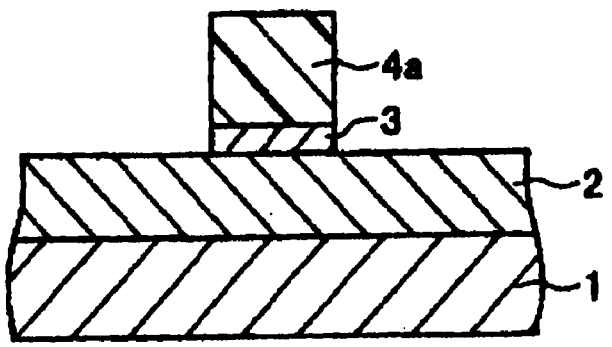
FIG. 3 shows a method for manufacturing a semiconductor device in accordance with an embodiment of the present invention, and shows a cross-sectional view of the next step after FIG. 2.

Then, as shown in FIG. 3, the BARC 3 is dry-etched using the resist pattern 4a as mask. The etching condition in this embodiment may be as follows: A mixed gas of $Cl_2/CHF_3/Ar$ is used as an etching gas, and the gas flow quantity is set with $Cl_2$ gas being 40–80 sccm, $CHF_3$ gas being 0–10 sccm, and Ar gas being 0–100 sccm. Also, Ar gas may be used in the etching gas, but an etching may also be conducted without using Ar gas.

Figure 4:
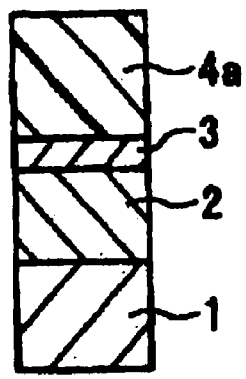
FIG. 4 shows a method for manufacturing a semiconductor device in accordance with an embodiment of the present invention, and shows a cross-sectional view of the next step after FIG. 3.

As shown in FIG. 4, the TiN film 2 is dry-etched using the resist pattern 4a as a mask. This etching is continuously conducted to etch the BARC 3. Then, the underlying layer 1 composed on the Al alloy film and the TiN film is continuously etched.

Figure 5:
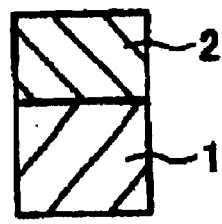
FIG. 5 shows a method for manufacturing a semiconductor device in accordance with an embodiment of the present invention, and shows a cross-sectional view of the next step after FIG. 4.
Figure 6:
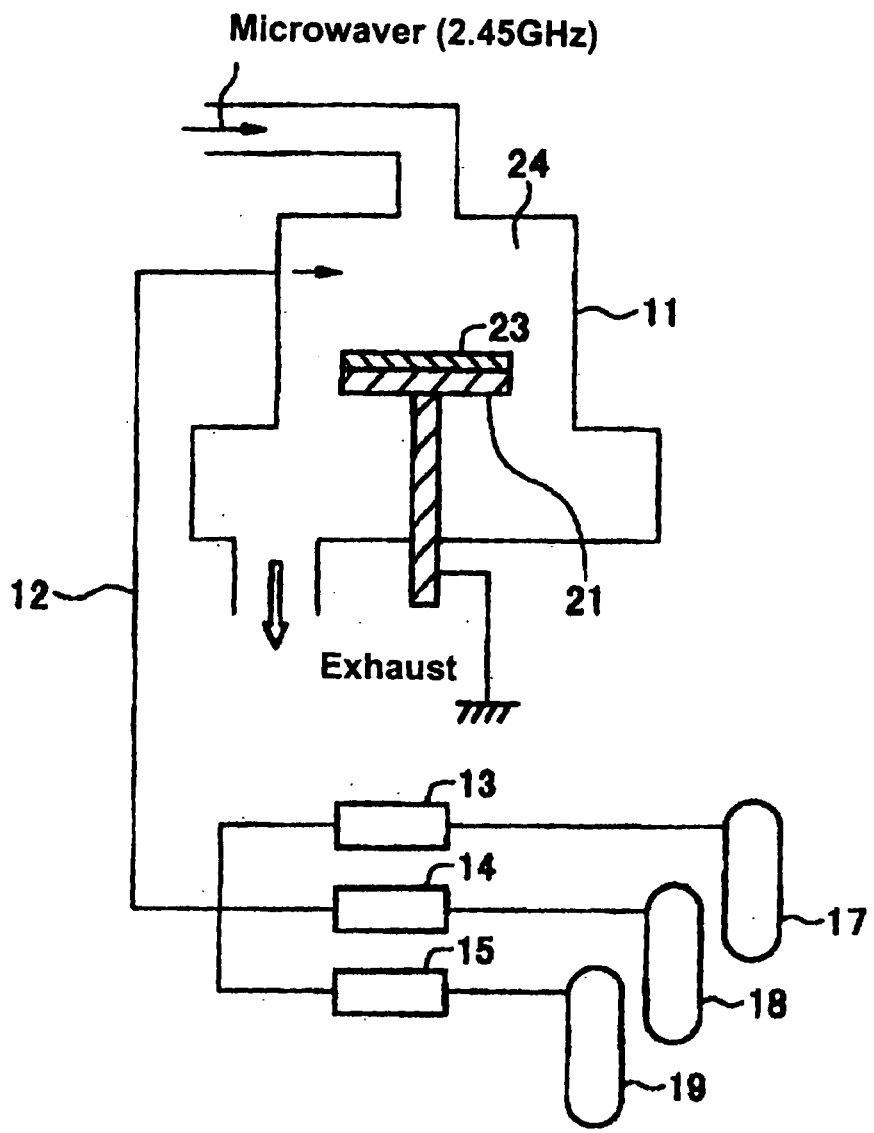
FIG. 6 shows a structure of an ashing apparatus to be used when a resist pattern and a BARC (anti-reflection coating) shown in FIG. 4 are removed.

Next, as shown in FIG. 5, the resist pattern 4a and the BARC 3 are removed by an ashing apparatus.

The wafer including a cross section shown in FIG. 4 is removed from the etching apparatus, and the wafer is preferably transferred in vacuum and fed in an ashing chamber of the ashing apparatus without exposing the wafer to the atmosphere. An example of the ashing apparatus will be described below. Next, the wafer is mounted on a stage, and the wafer is retained on the stage for about 5 seconds to about 7 seconds in order to adjust and stabilize the pressure inside the ashing chamber. Then, an ashing process is preferably conducted in two stages. The ashing in the first step is conducted under a condition in which a mixed gas of $O_2/N_2$ is used as an ashing gas, the gas flow amount is set with $O_2$ gas being 100–1000 sccm, and $N_2$ gas being 100–500 sccm, and the ashing is conducted for about 30—about 60 seconds. The ashing in the second step is conducted under a condition in which $H_2O$ gas is used as an ashing gas, the gas flow amount is set to be 100–500 sccm, and the ashing is conducted for about 20—about 40 seconds (most preferably about 30 seconds). The ashing steps in two stages are preferably continuously conducted.

As shown in FIG. 6, the ashing apparatus has an ashing chamber 11, an exhaust outlet is provided in the ashing chamber, and the exhaust outlet is connected to a vacuum pump. Also, a gas introduction inlet is provided in the ashing chamber 11, and the gas introduction inlet is connected to one end of a gas line 12.

First through third flow quantity controllers 13–15 are connected to the other end of the gas line 12. The first flow quantity controller 13 connects to an $O_2$ gas supply 17, and the second flow quantity controller 14 connects to an $N_2$ gas supply 18. The third flow quantity controller 15 connects to an $H_2O$ gas supply 19.

A stage 21 for mounting thereon a wafer 23 that is a body to be processed is disposed in the ashing chamber 11. The stage 21 is formed such that it can be controlled to have an elevated temperature of about 250° C. The stage 21 connects to a ground potential. Also, an introduction inlet that introduces microwave (e.g., 2.45 GHz) is disposed inside the ashing chamber at a location opposing to the stage 21.

Next, an ashing method using the ashing apparatus shown in FIG. 6 will be described. This ashing apparatus is a microwave down flow-type asher.

First, a wafer 23 on which a BARC 3 and a resist pattern 4a are formed on a TiN film 2 such as the one shown in FIG. 4 is introduced in the ashing chamber 11, and the wafer 23 is retained on the stage 21. The wafer 23 is retained on the stage 21 for about 5 to about 7 seconds to adjust and stabilize the pressure inside the ashing chamber 11. In this instance, the temperature of the stage is controlled to be about 250° C.

Then, the first ashing step is conducted. More specifically, $O_2$ gas and $N_2$ gas from the $O_2$ gas supply 17 and the $N_2$ gas supply 18 are conducted through the gas line 12 to the inside of the ashing chamber 11 as indicated by an arrow. As a result, the mixed gas of $O_2/N_2$ is introduced above the wafer 23. The gas flow quantity in this instance is controlled by the first and second flow quantity controllers 13 and 14. Then, microwave with 2.45 GHz is intruded into the ashing chamber from above the wafer 23. This plasmatizes the gas such that the resist pattern 4a and the BARC 3 are ashed.

Next, the second ashing step is conducted. More specifically, the $O_2$ gas supply 17 and the $N_2$ gas supply 18 are closed, and the $H_2O$ gas supply 19 is opened, to thereby switch the ashing gas from the $O_2$ and $N_2$ gases to $H_2O$ gas. This introduces $H_2O$ gas into the ashing chamber 11 through the gas line 12 as indicated by an arrow. By this, $H_2O$ gas is introduced above the wafer 23. The gas flow quantity in this instance is controlled by the third flow quantity controller 15. Then, microwave with 2.45 GHz is intruded into the ashing chamber from above the wafer 23. This plasmatizes the gas such that the BARC 3 is ashed. Accordingly, even when the etching of the Al alloy film and the etching of the TiN film are conducted in the same etching chamber, and products (Al—Cl) remaining in the etching chamber may remain on the wafer 23, the products can be removed.

In the embodiment described above, the wafer is taken out from the etching apparatus, transferred in vacuum without exposing the wafer to the atmosphere and fed in the ashing chamber of the ashing apparatus. As a result, even when products (Al—Cl) remaining in the etching chamber may remain on the wafer, the residual products can be prevented from reacting with water in the atmosphere. Also, as described above, by conducting the second ashing step, products remaining on the wafer 23 can be removed.

Also, in the embodiment described above, the wafer is mounted on the stage, and the time for retaining the wafer on the stage is short (5 seconds to 7 seconds). As a result, hardening of the BARC 3 can be prevented. Accordingly, even if the resist pattern 4a and the BARC 3 are removed by ashing, BARC residues can be prevented from remaining as ashing residues on the TiN film, as indicated in FIG. 5. As a result, the reliability of the semiconductor device can be improved.

It is noted that the etching apparatus in accordance with the present embodiment can be used as an etching apparatus for etching Al alloy films. Therefore, an etching apparatus for Al alloy films can also be used to etch BARCs.

In accordance with the embodiments of present invention as described above, even when products remaining in the etching chamber may remain on bodies to be processed, $H_2O$ gas is plasmatized to ash foreign matters on the TiN film, such that the foreign matters can be removed. Accordingly, the present invention provides an ashing apparatus, an ashing method, and a method for manufacturing semiconductor devices that can reduce foreign matters that may remain on bodies to be processed.

Also, in accordance with certain embodiments of the present invention, the time for retaining bodies to be processed on the stage is made short (5 seconds–7 seconds), which may contribute to certain embodiments of the present invention providing an ashing apparatus, an ashing method, and a method for manufacturing semiconductor devices that can suppress ashing residues from remaining on the TiN film.

Also, the present invention is not limited to the embodiments described above, but many modifications can be made. For example, the ashing conditions such as the flow quantity of ashing gas can be appropriately changed. In addition, embodiments my be applicable to processing layers formed from materials other than those described above, and other gases (etching, ashing) may also find use in certain embodiments.

What is claimed:

1. An ashing apparatus to ash a photoresist film on a body in which a conducting film has been etched using the photoresist film as a mask, the apparatus comprising:
   an ashing chamber;
   a stage for mounting a body to be processed disposed in the ashing chamber;
   a gas introduction system including a controller system configured to control gas flow into the ashing chamber during first and second ashing operations so that during the second ashing operation ashing gas consisting of $H_2O$ is introduced into the ashing chamber; and
   a plasma system that forms a plasma in during the first and second ashing operations in the ashing chamber.

2. An ashing apparatus according to claim 1, wherein the controller system is configured to control gas flow into the ashing chamber so that during the first ashing operation ashing gas comprising $O_2$ gas and $N_2$ gas is introduced into the ashing chamber.

3. An ashing apparatus as in claim 2, wherein the gas introduction system is configured so that the gas flow into the ashing chamber takes place adjacent to the body to be processed.

4. An ashing apparatus according to claim 3, wherein the body to be processed includes a TiN film formed over an underlying film, a BARC formed on the TiN film, and a photoresist film formed on the BARC film.

5. An apparatus as in claim 3, further comprising a temperature control system adapted to heat the stage to a temperature sufficient to ash the photoresist.

6. An ashing apparatus according to claim 1, wherein the body to be processed includes a TiN film formed over an underlying film, a BARC formed on the TiN film, and a photoresist film formed on the BARC film.

7. An ashing apparatus according to claim 6, further comprising a temperature controlling system that controls the stage to be at an elevated temperature so that before the first ashing operation, the body to be processed is maintained for 5 to 7 seconds on the stage that is controlled to be at an elevated temperature in order to adjust and stabilize a pressure inside the ashing chamber.

8. An ashing apparatus as in claim 1,
wherein the controller system is configured to control gas flow into the ashing chamber so that during the first ashing operation ashing gas consisting of $O_2$ gas and $N_2$ gas is introduced into the ashing chamber.

9. An ashing apparatus for ashing a photoresist film on a body in which a conducting film has been etched using the photoresist film as a mask, the apparatus comprising:

an ashing chamber;

a stage for mounting a body to be processed disposed in the ashing chamber;

a temperature controller to raise and lower the temperature of the stage in the ashing chamber;

a gas introduction system including a controller system configured to open an ashing gas supply consisting of $O_2$ gas and $N_2$ gas into the ashing chamber during a first ashing operation, then closing the ashing gas supply consisting of $O_2$ and $N_2$ into the ashing chamber, then opening an ashing gas supply consisting of $H_2O$ into the ashing chamber; and a plasma system that forms a plasma in the ashing chamber during the first ashing operation and during the second ashing operation.

* * * * *